(12) United States Patent
Kao et al.

(10) Patent No.: US 8,076,207 B2
(45) Date of Patent: Dec. 13, 2011

(54) GATE STRUCTURE AND METHOD OF MAKING THE SAME

(75) Inventors: Ching-Hung Kao, Hsin-Chu Hsien (TW); Chien-En Hsu, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 77 days.

(21) Appl. No.: 12/502,235

(22) Filed: Jul. 14, 2009

(65) Prior Publication Data

US 2011/0012209 A1  Jan. 20, 2011

(51) Int. Cl.
*H01L 21/336* (2006.01)

(52) U.S. Cl. ............... 438/287; 438/283; 257/E21.415; 257/E21.429

(58) Field of Classification Search ............. 438/283, 438/217, 202, 224, 232, 264, 287; 257/E21.415, 257/E21.429, E21.433
See application file for complete search history.

(56) References Cited

U.S. PATENT DOCUMENTS

| | | | |
|---|---|---|---|
| 6,251,719 B1 | 6/2001 | Wang | |
| 6,706,601 B1 | 3/2004 | Liu | |
| 2008/0293199 A1* | 11/2008 | Lin et al. | 438/261 |

* cited by examiner

*Primary Examiner* — Walter L Lindsay, Jr.
(74) *Attorney, Agent, or Firm* — Winston Hsu; Scott Margo

(57) ABSTRACT

A method of making a gate structure includes the following steps. First, a gate is formed. Then, a first silicon oxide layer, a silicon nitride layer, and a second silicon oxide layer are formed to cover the gate from bottom to top. Later, a dry etching is performed to etch the second silicon oxide layer. After that, a wet etching is performed to etch the silicon nitride layer and the first silicon oxide layer. The aforesaid wet etching is performed by utilizing an RCA cleaning solution. Furthermore, the silicon nitride layer is formed by the SINGEN process. Therefore, the first and second silicon oxide layer and the silicon nitride layer can be etched together by the RCA cleaning solution.

12 Claims, 3 Drawing Sheets

GATE STRUCTURE AND METHOD OF MAKING THE SAME

BACKGROUND OF THE INVENTION

1. Field of the Invention

The present invention relates to a method of making a gate structure and a related gate structure, and more particularly, to a method of making a gate structure used in CMOS image sensors (CISs) and a related gate structure used in CISs.

2. Description of the Prior Art

Charge-coupled devices (CCDs) have been the mainstay of conventional imaging circuits for converting light into electrical signals. The applications of CCDs include monitors, transcription machines, and cameras. Although CCDs have many advantages, CCDs also suffer from high costs and the limitations imposed by their size. To overcome the weaknesses of CCDs and to reduce costs and dimensions, CMOS image sensors (CISs) have been developed. Photodiodes on a CIS have a similar function as CCDs. Since photodiodes of CISs can be produced using conventional techniques, both cost and size of the sensor can be reduced.

Each conventional CIS can be divided into a photosensitive region and a device region. Generally, at least one photodiode is positioned on the photosensitive region. The photodiode and a transfer transistor, a reset transistor, a source follower transistor and a select transistor in the device region form a CIS unit. The photodiode usually receives the incoming light and converts the light into current signals. The devices in the device region are used to transfer the signal to outer electric circuits.

Traditionally, taking a CIS unit as an example, when forming spacers on transistors of a CIS, a spacer material layer is firstly formed on every gate. At this time, the spacer material layer covers every gate and the photodiode. Then, a dry etching process such as plasma treatment is performed to remove the spacer material layer partly, and form spacers on every gate. While the dry etching is being performed, the spacer material layer on the top surface of the gates and the top surface of the photodiode is almost totally removed by the plasma. Therefore, the exposed surface of the photodiode is bombarded by the plasma, and the silicon lattice of the photodiode is damaged. As a result, the dark current of the photodiode will become unstable, and noise will occur during the operation.

In recently developed fabricating processes, in order to avoid the surface of the photodiode being bombarded by the plasma, a patterned photoresistor is formed on the photodiode. However, an extra photo mask and extra steps are needed to form the aforesaid patterned photoresistor. Therefore, the productivity is decreased. Furthermore, after the spacers are formed, the top surface of the photodiode is still covered by the spacer material layer. The remaining spacer material layer on the photodiode will influence currents formed by the photodiode and the sensitivity of the photodiode will be decreased.

SUMMARY OF THE INVENTION

Therefore, the present invention provides a method for fabricating a gate structure of a CIS to prevent the photodiode from being affected by the plasma during fabrication of spacers.

According to the claimed invention, a method for forming a gate structure is provided. The method comprises steps of forming a gate, forming a first silicon oxide layer, a silicon nitride layer and a second silicon oxide layer covering the gate from bottom to top, performing a dry etching process to etch the second silicon oxide layer and performing a wet etching process to etch the silicon nitride and the first silicon oxide layer.

According to the claimed invention, a gate structure is also provided. The gate structure comprises a gate; and a spacer positioned at a sidewall of the gate, where the spacer comprises an oxide-nitride-oxide (ONO) stack layer formed by a first silicon oxide layer, a silicon nitride layer and a second silicon oxide layer, the silicon nitride layer being substantially unetched by phosphoric acid.

The feature of the present invention is that the silicon nitride layer of the ONO stack layer is formed by the SINGEN method. The silicon nitride layer formed by the SINGEN method not only will be substantially unetched by phosphoric acid, but also can be etched by an RCA cleaning solution. After the ONO stack layer is formed, a dry etching process is performed to remove part of the second silicon oxide layer. After that, a wet etching process is performed to etch the first silicon oxide layer, silicon nitride layer and the second silicon oxide layer. Then, a spacer can be formed on the gate without damage the surface of the photodiode.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
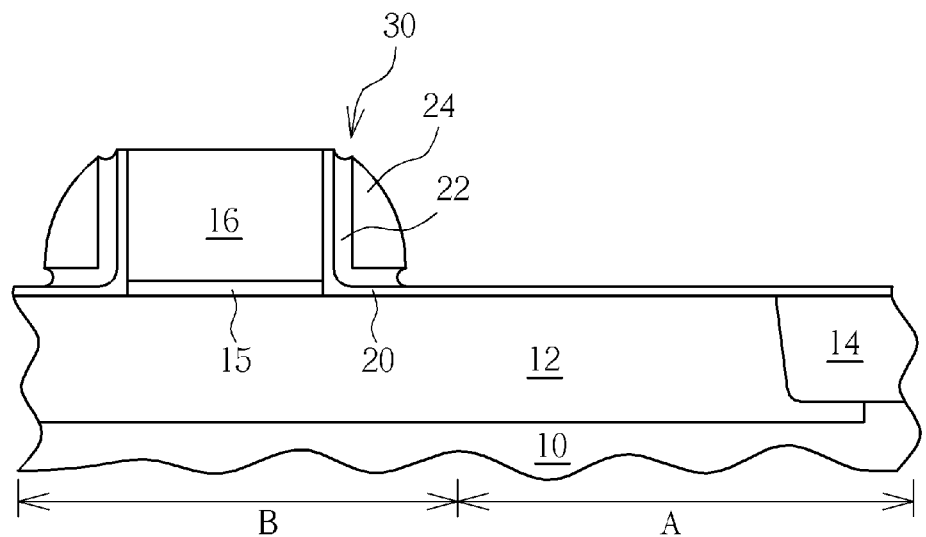
FIG. 5 shows a schematic drawing illustrating a gate structure with a defect.
Figure 6:
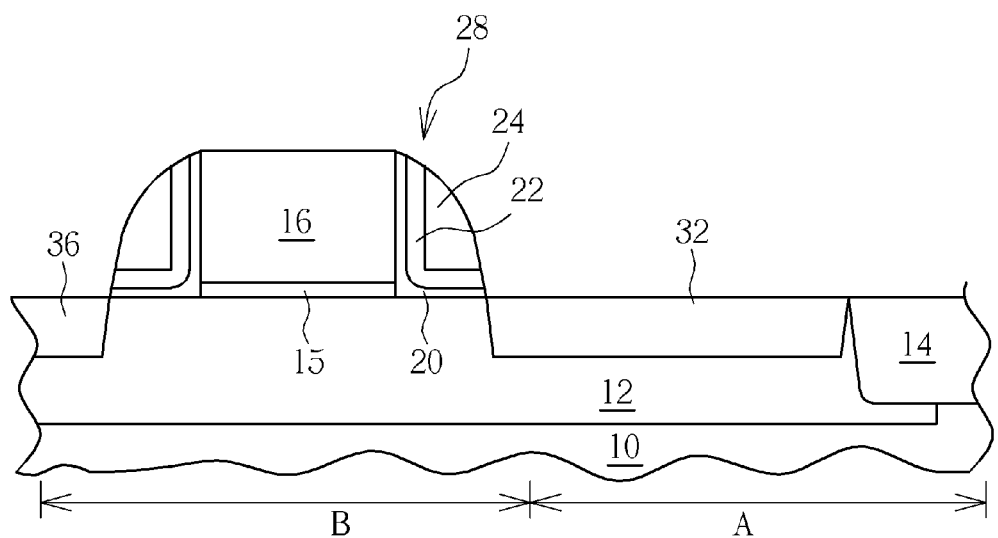
FIG. 6 is a schematic drawing illustrating a method of forming a CIS.

Please refer to FIGS. 1-4, which are schematic drawings illustrating a method of forming a gate structure according to a preferred embodiment of the present invention. FIG. 5 shows a schematic drawing illustrating a gate structure with a defect. FIG. 6 is a schematic drawing illustrating a method of forming a CIS.

Figure 1:
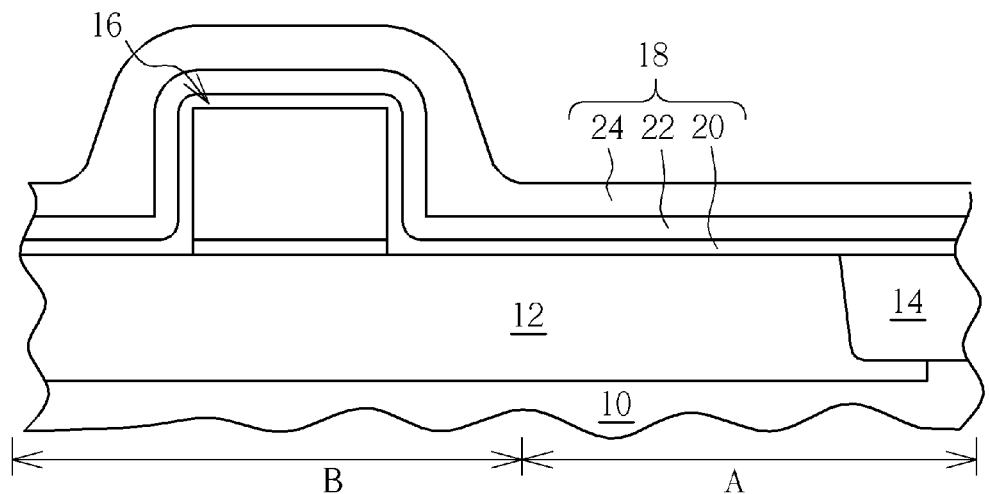
FIGS. 1-4 are schematic drawings illustrating a method of forming a gate structure according to a preferred embodiment of the present invention.

The following embodiment is illustrated by taking a singe CIS unit as an example. As shown in FIG. 1, a substrate 10, such as a silicon substrate or a silicon on insulator (SOI) substrate, is provided. The substrate 10 includes at least a P-type doping well 12 and at least a shallow trench isolation (STI) structure 14. The P-type doping well 12 can be divided into at least a photosensitive region A and at least a device region B. The forming steps of aforesaid elements such as the doping well 12 or the STI structure 14 are well-known to those skilled in the art and details are therefore omitted here.

A gate 16 is then formed on the device region B. The method of forming the gate 16 may include forming a dielectric layer (not shown) blankly on the substrate 10. The dielectric layer can be a silicon nitride layer formed by thermal oxidation, or any dielectric material formed by deposition. Then, a conductive layer (not shown) is formed on the dielectric layer. The conductive layer includes polysilicon, polycide, metal or metal alloys, among others. Following that, an etching process is performed to etch the dielectric layer and the conductive layer to form the gate 16 on the substrate 10. Later, as shown in FIG. 1, a spacer material layer 18 is formed to cover the surface of the substrate 10 and the gate 16. The spacer material layer 18 is an oxide-nitride-oxide (ONO) stack layer. The ONO stack layer can be formed by forming a first silicon oxide layer 20, a silicon nitride layer 22 and a second silicon oxide layer 24 covering the gate 16 and the substrate 10 from bottom to top. The first silicon oxide layer 20 can be formed by a conventional deposition process. The thickness of the first silicon layer 20 is preferably around 100 angstroms. The second silicon oxide layer 24 can also be formed by a conventional deposition process. It is noteworthy that the silicon nitride layer 22 in the present invention is formed by a SINGEN method. For example, the silicon nitride layer 22 is formed by "Applied Centura SiNgenPlus LPCVD" provided by Applied Materials, Inc. The silicon nitride layer 22 formed by the SINGEN method is less dense than in conventional methods, and cannot be substantially etched by phosphoric acid. The above-mentioned "Applied Centura SiNgenPlus LPCVD" is a single-wafer LPCVD silicon nitride deposition system that can deliver low temperature deposition, preferably around 600-800° C., and provide better silicon nitride performance.

Figure 2:
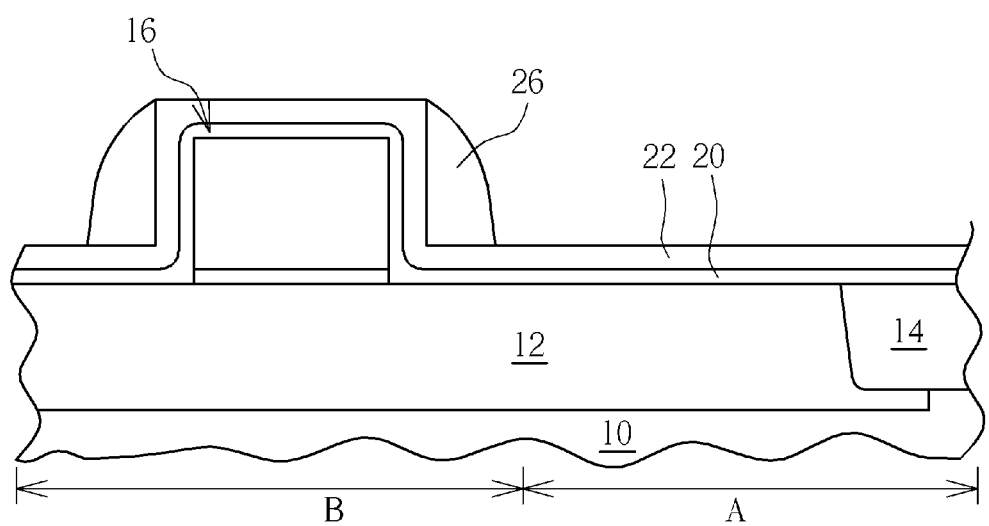
Figure 3:
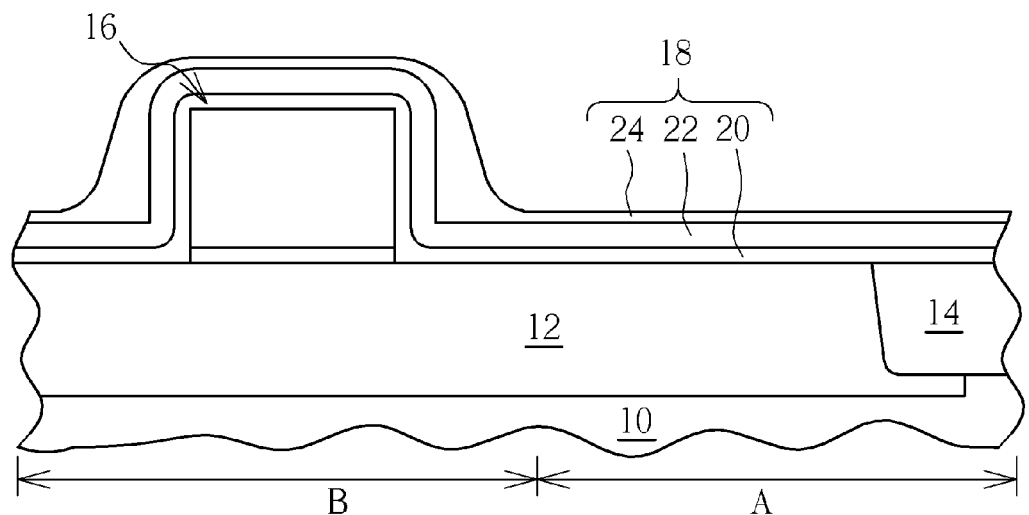

As shown in FIG. 2, a dry etching process, such as a plasma treatment, is performed to etch the second silicon oxide layer 24 primarily. During the dry etching process the silicon nitride layer 22 can serve as a stop layer. The second silicon oxide layer 24 after dry etching forms a spacer 26 on the sidewall of the gate 16. More specifically, the second silicon oxide layer 24 positioned on the top of the gate 16 and on the substrate 10 where uncovered by the gate 16 is removed totally by the plasma, and the silicon nitride layer 22 originally under the second silicon oxide layer 24 is exposed. Furthermore, the second silicon oxide layer 24 remaining on the sidewall of the gate 16 forms the spacer 26. Alternatively, as shown in FIG. 3, there may be some residue of the second silicon oxide layer 24 on the top of the gate 16 and substrate 10 after the dry etching process. The following fabricating processes can be applied to situations where the second silicon oxide layer 24 remains on the top of the gate 16 and substrate 10 and where the second silicon oxide layer 24 does not remain on the top of the gate 16 and substrate 10.

Figure 4:
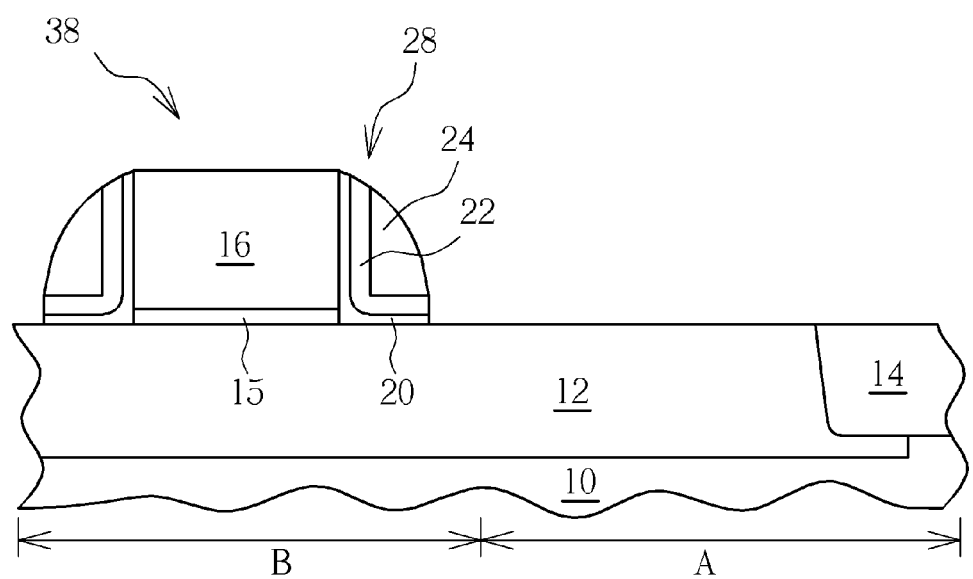

Later, as shown in FIG. 4, a wet etching process is performed to etch the silicon nitride layer 22 and the first silicon oxide layer 20 primarily, and the second silicon oxide layer 24 is also collaterally etched. After the wet etching process, a spacer 28 composed of the first silicon oxide layer 20, the silicon nitride layer 22 and the second silicon oxide layer 24 is formed. At this point, the gate structure 38 of the present invention is completed. The gate structure 38 of the present invention can be applied to transfer transistors, reset transistors, source follower transistors, and select transistors in CIS.

It is noteworthy that the aforesaid wet etching process uses RCA cleaning solution to etch the silicon nitride layer 22, the first silicon oxide layer 20 and the second silicon oxide layer 24. Generally, the RCA cleaning solution including $NH_4OH$ and $H_2O_2$ is used to clean the native oxide on the wafer or clean residue on the wafer after etching processes. Traditionally, the silicon nitride layer formed by a conventional chemical vapor deposition (CVD) process can be etched by phosphoric acid, because phosphoric acid has a high etching selectivity ratio of the silicon nitride layer to the silicon oxide layer. Therefore, phosphoric acid almost only etches the silicon nitride layer, and does not etch the silicon oxide layer. However, as shown in FIG. 5, if phosphoric acid is used as an etching solution to etch the silicon nitride layer 22, a defect 30 such as an undercut in the silicon nitride layer 22 under the second silicon oxide layer 24 will occur.

Because the silicon nitride layer 22 of the present invention is formed by the SINGEN method, however, the silicon nitride layer 22 will have a less dense structure compared to a silicon nitride layer formed by a common CVD process. Therefore, the silicon nitride layer 22, the first silicon oxide layer 20 and the second silicon oxide layer 24 can be etched by RCA cleaning solution during the same wet etching process, and a gate structure 38 without defect 30 as shown in FIG. 4 can be formed.

The feature of the present invention is that a dry etching process and a wet etching process are performed in sequence to etch the ONO stack layer to form a spacer. That is, the dry etching process is performed to etch the second silicon oxide layer 24 primarily and the silicon nitride layer 22 serves as a stop layer. Then, the wet etching is performed by using RCA cleaning solution as an etching solution to etch the silicon nitride layer 22 and the first silicon oxide layer 20 primarily and the second silicon oxide layer 24 is also collaterally etched. Then, the spacer 28 is formed. Traditional fabricating steps usually use only a dry etching process or only a wet etching process to etch the spacer material layer, such as the ONO stack layer to form a spacer. The silicon nitride layer 22 of the present invention is formed by the SINGEN process, therefore the silicon nitride layer 22, the first silicon oxide layer 20 and the second silicon oxide layer 24 can be etched by RCA cleaning solution. As a result, the spacer 28 without defect can be formed. Moreover, because the first silicon oxide layer 20 is removed by the wet etching process, the surface of the photosensitive region A will not be bombarded by the plasma, and the lattice of the silicon will not be damaged. In addition, extra steps such as forming a photoresist layer for protecting the photosensitive region A, and removing the photoresist layer are not needed.

After the gate structure 38 is completed, a photodiode and a source/drain region for the gate structure 38 are formed. As shown in FIG. 6, a first patterned photoresist layer (not shown) covers the substrate 10, the STI structure 14 and the gate structure 38, and exposes the photosensitive region A. Later, an N-type dopant such as phosphorous or arsenic is implanted into the photosensitive region A on the substrate 10, and then an N-type doping region 32 is formed. At this point, a photodiode is completed. Next, the first patterned photoresist layer is removed. After that, a second patterned photoresist layer (not shown) is formed to be a mask, and an N-type doping region 36 at a side of the gate structure 38 is formed. At this point, a CIS is completed.

Finally, as shown in FIG. 4, the gate structure 38 provided in the present invention can be applied to the transfer transistors, reset transistors, source follower transistors and select transistors or other CMOS transistor in the peripheral region. The gate structure 38 of the present invention is positioned on a substrate 10. The gate structure 38 includes a gate 16, a spacer 28 positioned at a sidewall of the gate 16, and the spacer 28 comprises an oxide-nitride-oxide (ONO) stack layer formed by a first silicon oxide layer 20, a silicon nitride layer 22 and a second silicon oxide layer 24. It is noteworthy that the silicon nitride layer 22 substantially cannot be etched by phosphoric acid. In addition, the gate 16 further comprises a dielectric layer 15 positioned on the substrate 10. According to a preferred embodiment of the present invention, the thickness of the first silicon oxide layer 20 is about 100 angstroms, and formed by an oxidizing process. The second silicon oxide layer 24 can be formed by a deposition process.

Those skilled in the art will readily observe that numerous modifications and alterations of the device and method may be made while retaining the teachings of the invention.

What is claimed is:

1. A method of forming a gate structure, comprising:
   forming a gate;
   forming a first silicon oxide layer, a silicon nitride layer and a second silicon oxide layer covering the gate from bottom to top;
   performing a dry etching process to etch the second silicon oxide layer; and
   performing a wet etching process to etch the silicon nitride and the first silicon oxide layer.

2. The method of claim 1, wherein the first silicon oxide layer, the silicon nitride layer and the second silicon oxide layer form an oxide-nitride-oxide (ONO) stack layer.

3. The method of claim 1, wherein the silicon nitride layer substantially cannot be etched by phosphoric acid.

4. The method of claim 1, wherein the etching solution is an RCA cleaning solution.

5. The method of claim 4, wherein the RCA cleaning solution comprises $NH_4OH$ and $H_2O_2$.

6. The method of claim 1, wherein the dry etching process is stopped when the silicon nitride layer is exposed.

7. The method of claim 1, wherein the first silicon oxide layer, the silicon nitride layer and the second silicon oxide layer are etched during the wet etching process until the silicon nitride layer on the top of the gate is removed completely and part of the first silicon oxide layer is removed, and the first silicon oxide layer, the silicon nitride layer and the second silicon oxide layer after etching together form a spacer.

8. The method of claim 1, wherein the gate structure can be applied to a transfer transistor, a reset transistor, a source follower transistor, or a select transistor.

9. A gate structure, comprising:
   a gate; and
   a spacer positioned at a sidewall of the gate, the spacer comprising an oxide-nitride-oxide (ONO) stack layer formed by a first silicon oxide layer, a silicon nitride layer and a second silicon oxide layer, the silicon nitride layer unetched by phosphoric acid so that an undercut does not occur in the silicon nitride layer.

10. The gate structure of claim 9, wherein the first silicon oxide layer covers the sidewall of the gate completely.

11. The gate structure of claim 9, wherein the gate further comprises a dielectric layer positioned on a substrate.

12. The gate structure of claim 9, wherein the thickness of the first silicon oxide layer is 100 angstroms.

* * * * *